(12) United States Patent
Sakurai et al.

(10) Patent No.: US 6,168,025 B1
(45) Date of Patent: Jan. 2, 2001

(54) WAFER HOLDING STRUCTURE FOR SEMICONDUCTOR WAFER CONTAINERS

(75) Inventors: Youichi Sakurai; Ryou Miyahara, both of Kanagawa; Ryousei Ichino; Akira Nakai, both of Tokyo, all of (JP)

(73) Assignees: Komatsu Electronic Metals Co., Ltd., Kanagawa; Komatsu Plastics Industry Co., Ltd., Tokyo, both of (JP)

( * ) Notice: Under 35 U.S.C. 154(b), the term of this patent shall be extended for 0 days.

(21) Appl. No.: 08/980,363

(22) Filed: Nov. 28, 1997

(30) Foreign Application Priority Data

Nov. 28, 1996  (JP) .................................................. 8-353847

(51) Int. Cl.⁷ .................................................. B65D 85/30
(52) U.S. Cl. ........................ 206/711; 206/707; 211/41.18
(58) Field of Search .................................. 206/707, 711, 206/722, 454; 211/41.17, 41.18, 41.1

(56) References Cited

U.S. PATENT DOCUMENTS

| 3,934,733 | * | 1/1976 | Worden | 214/1 Q |
|---|---|---|---|---|
| 4,061,228 | * | 12/1977 | Johnson | 206/454 |
| 4,248,346 | * | 2/1981 | Johnson | 206/334 |
| 4,630,732 | * | 12/1986 | Snyman | 206/445 |
| 4,718,552 | * | 1/1988 | Rossi et al. | 206/444 |
| 4,752,007 | * | 6/1988 | Rossi et al. | 206/444 |
| 4,779,732 | * | 10/1988 | Boehm et al. | 206/454 |
| 4,817,799 | * | 4/1989 | Gregerson et al. | 206/445 |
| 5,025,924 | * | 6/1991 | Watanabe | 206/334 |
| 5,046,615 | * | 9/1991 | Nentl et al. | 206/454 |
| 5,253,755 | * | 10/1993 | Maenke | 206/444 |

* cited by examiner

Primary Examiner—S. Thomas Hughes
Assistant Examiner—Trinh Nguyen
(74) Attorney, Agent, or Firm—Sughrue, Mion, Zinn, Macpeak & Seas, PLLC

(57) ABSTRACT

A holding blade is formed to be separated from a neighboring holding blades. A body of an elastic plate is separated from bodies of neighboring elastic plates. Each elastic plate base is integrally formed and connected with each corresponding elastic plate body. The thickness of the elastic plate gradually decreases from the junction between the elastic plate base and the frame portion toward its top end. The surface of the elastic plate is shaped in a curved manner. The cross-section of the elastic plate body is substantially rectangular in shape with a larger width in the horizontal direction, and terrace portion extends outward from the elastic plate body.

8 Claims, 5 Drawing Sheets

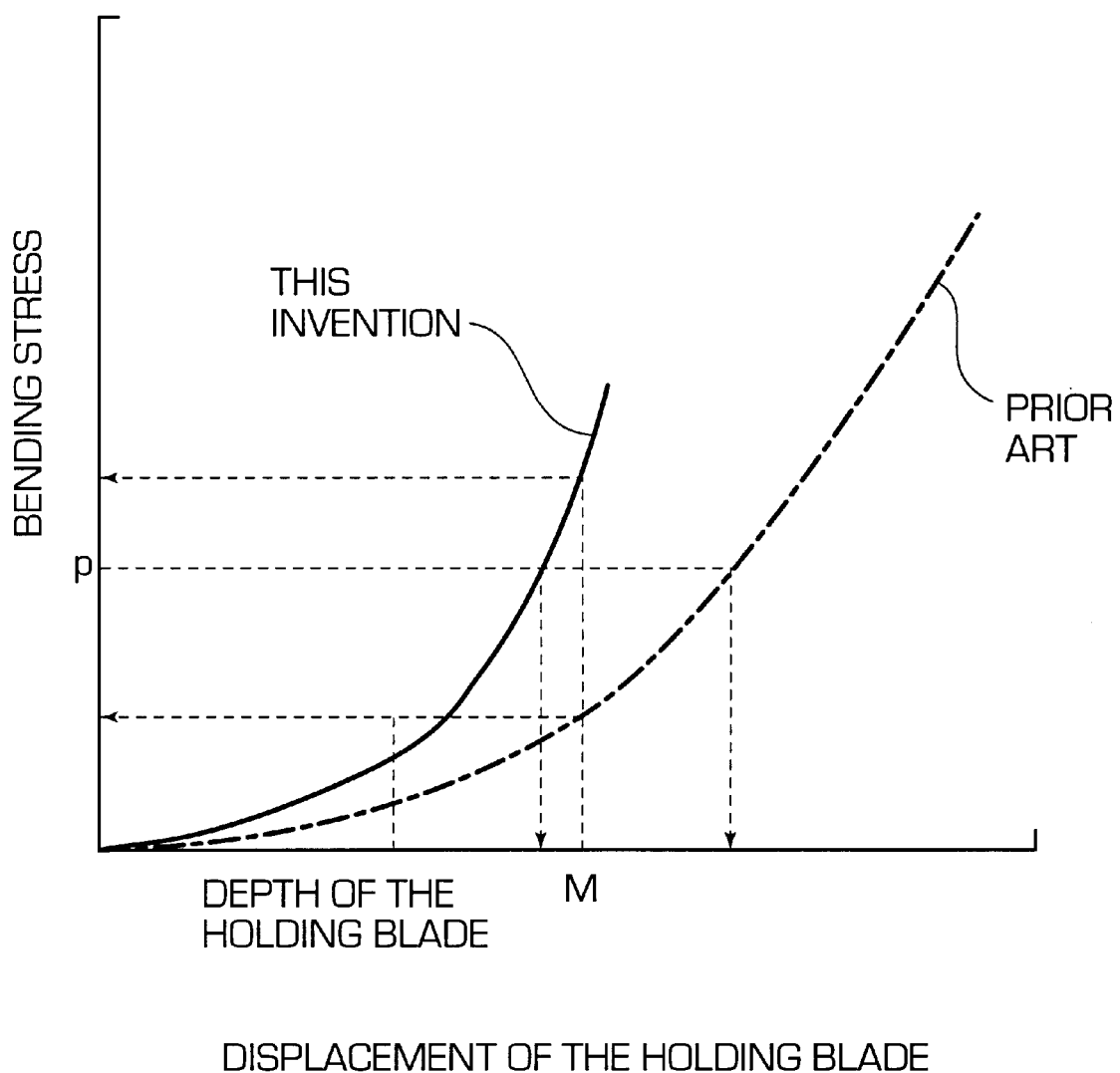

WAFER HOLDING STRUCTURE FOR SEMICONDUCTOR WAFER CONTAINERS

BACKGROUND OF THE INVENTION

1. Field of the Invention

This invention relates to a wafer holding structure which is installed on the cover of semiconductor wafer container and is employed to push down and hold the wafers accommodated within the semiconductor wafer container.

2. Description of Related Art

There are many kinds of package containers employed to accommodate and convey semiconductor wafers. However, most of them consist of a carrier into which semiconductor wafers to be accommodated are inserted, a casing for accommodating the carrier therewithin, a cover engaging with the casing to seal the space enclosed by the casing, and a holding member for holding semiconductor wafers accommodated within the casing.

The conventional holding member is designed to be installed on the cover and to push down and hold the semiconductor wafers being inserted into the carrier one by one. Therefore, it must have a structure wherein semiconductor wafers accommodated in a partitioned manner do not disengage from the holding member even if subject to vibration or jarring during transportation.

The holding blades used to hold the semiconductor wafers are classified into two categories. One is that the neighboring holding blades are connected to each other, the other one is that each blade is separately formed. To compare the movements between the two categories of holding blades in response to any vibration of jarring that occurs during transportation, it is found that the connected holding blades have enhanced rigidity due to their connected structure and have strong resistance to being jarred by the semiconductor wafers. However, the neighboring holding blades are affected if one specified location incurs jarring. On the contrary, separately formed holding blades are not affected by the neighboring holding blades. Nevertheless, it is difficult to enhance the rigidity of each separately formed holding blade.

SUMMARY OF THE INVENTION

It is an object of the present invention to provide a semiconductor wafer holding structure in a container, which is capable of holding semiconductor wafers accommodated within a container and preventing semiconductor wafers from disengagement with the holding blade even if subject to vibration or jarring during transportation.

The semiconductor wafer holding structure according to this invention is disposed within a semiconductor wafer container within which accommodated semiconductor wafers are pushed down and held by the semiconductor wafer holding members. In the structure according to this invention, holding blades for contact with semiconductor wafers are formed at the top end of a wafer holding member, the holding blades are pushed down by the elastic force of the wafer holding member made of an elastic plate. Each holding blade is formed to separate from the neighboring ones, the body of the elastic plate is separated from the bodies of the neighboring ones, and the bases of the elastic plates are integrally formed and connected together.

Furthermore, the thickness of the elastic plate gradually decreases toward its top end.

Furthermore, the surface of the elastic plate is shaped in a curved manner.

Furthermore, the bending stress in the elastic plate, in response to the load coming from semiconductor wafers, is dispersed along the longitudinal axis thereof, and the location where stress distribution converges is set not to be at a boundary between the elastic plate and the frame portion to which the elastic plate is affixed.

Furthermore, the stress in the elastic plate is increased sharply before the displacement of the holding blade induced by the semiconductor wafer exceeds the depth of the holding blade.

Furthermore, there is a terrace portion formed at the base of the elastic plate.

Furthermore, the cross section of the elastic plate is set to be substantially a rectangular shape with larger width in the horizontal direction.

Furthermore, the elastic plate is installed on the cover by inserting its frame portion into an install slot formed in the cover, the thickness of the frame portion is set to be smaller than the width of the install slot and a plurality of protrusions are formed on the side walls of the frame portion.

Furthermore, the elastic plate is installed on the cover by way of the frame portion, frame engaging claws used to engage with the install claws of the cover are formed on the frame portion, and the frame engaging claws are formed on the frame portion surfaces without the holding blades.

BRIEF DESCRIPTION OF THE DRAWINGS

The present invention can be more fully understood by reading the subsequent detailed description and examples with reference made to the accompanying drawings, wherein:

FIG. 7 is a graph showing the relationship between the displacements of the holding blade and the stresses induced in a wafer holding structure of this invention and those in a conventional wafer holding structure.

DETAILED DESCRIPTION OF THE INVENTION

This invention relates to the structure of semiconductor wafer holding members which are adapted to push down and hold semiconductor wafers accommodated within a convey container. To prevent semiconductor wafers from disengaging with the holding blades when vibration or jarring occurs during transportation, the load exerted on the segment commencing from the joint between the frame portions of the wafer holding structure and the elastic plates to the top ends of the holding blades is dispersed so as to avoid concentration of the load. In addition, the elastic plates are formed into a shape that cannot be twisted easily.

Preferred embodiments of the present invention will be described as follows referring to the accompanying drawings.

Figure 1:
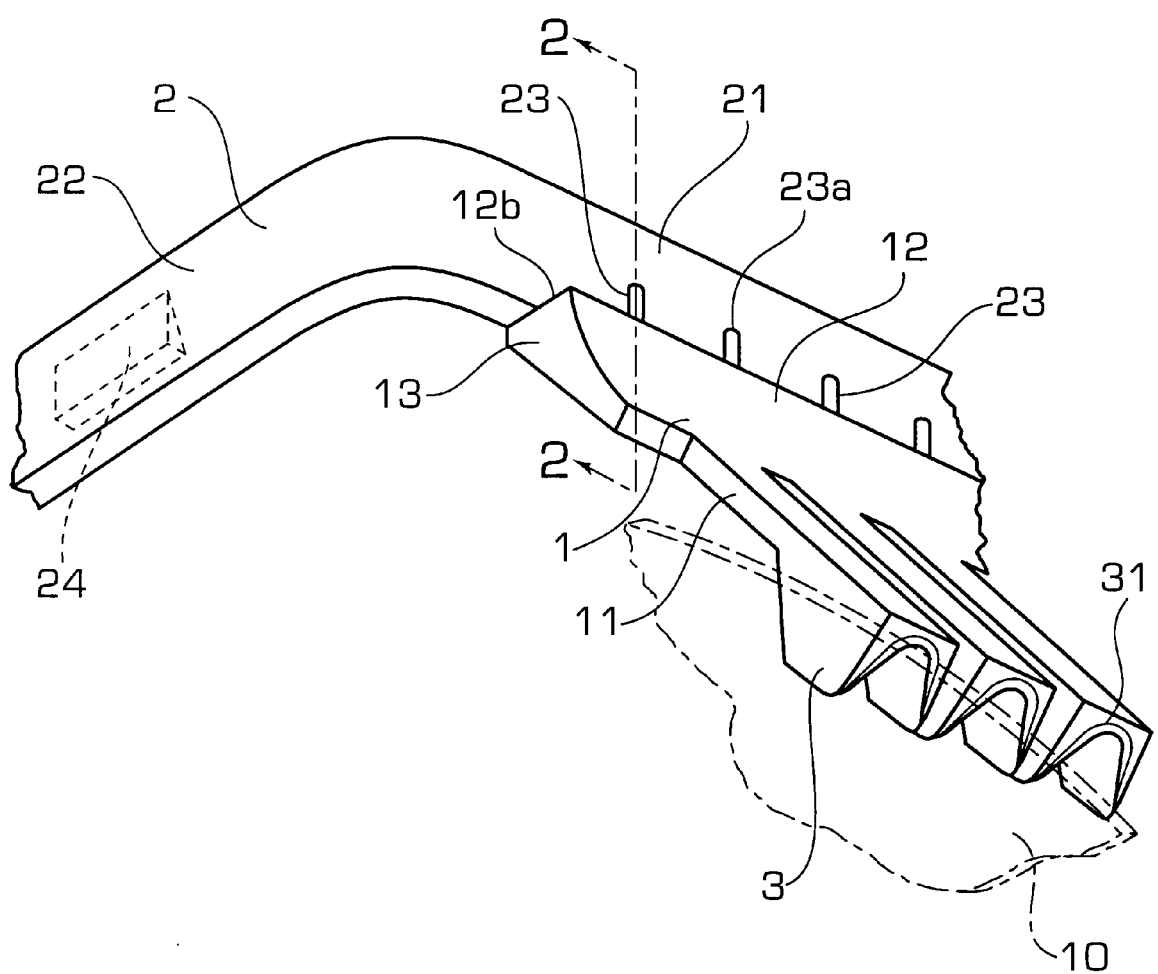
FIG. 1 is an enlarged perspective view of part of the wafer holding structure according to this invention.
Figure 2:
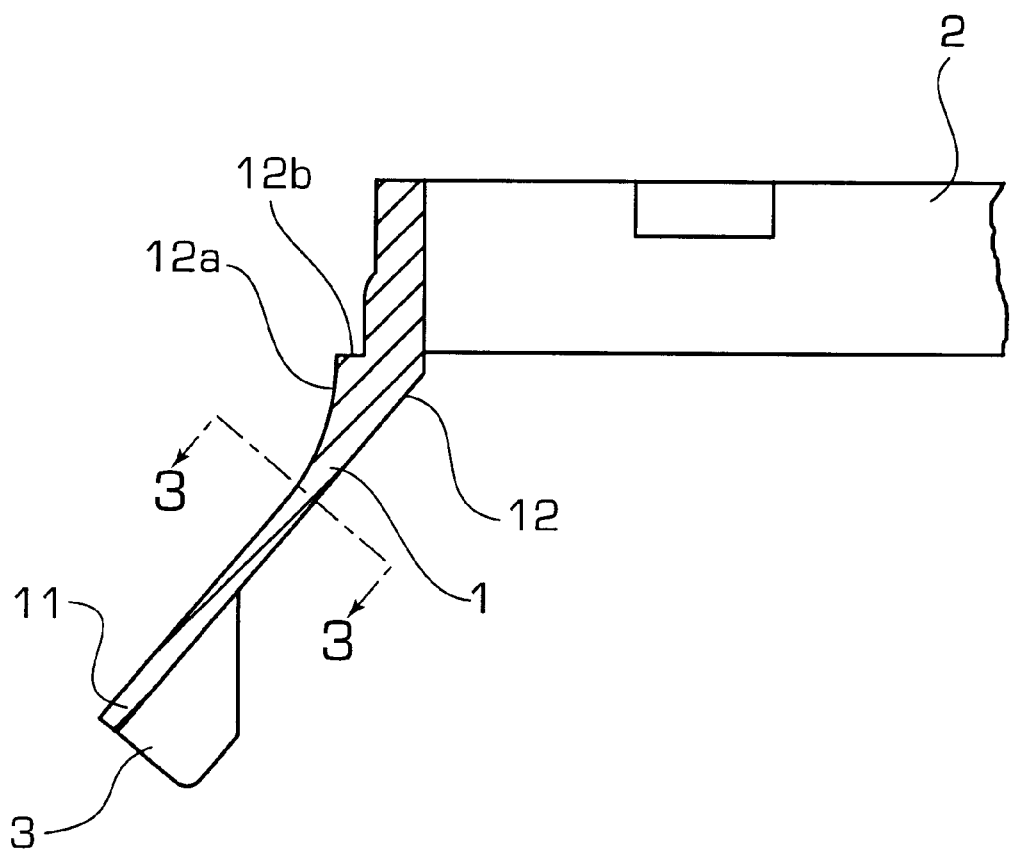
FIG. 2 is a cross-section view along the line A—A in FIG. 1.
Figure 3:
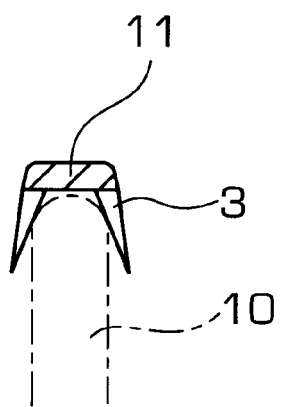
FIG. 3 is a cross-section view along the line B—B in FIG. 2.
Figure 4:
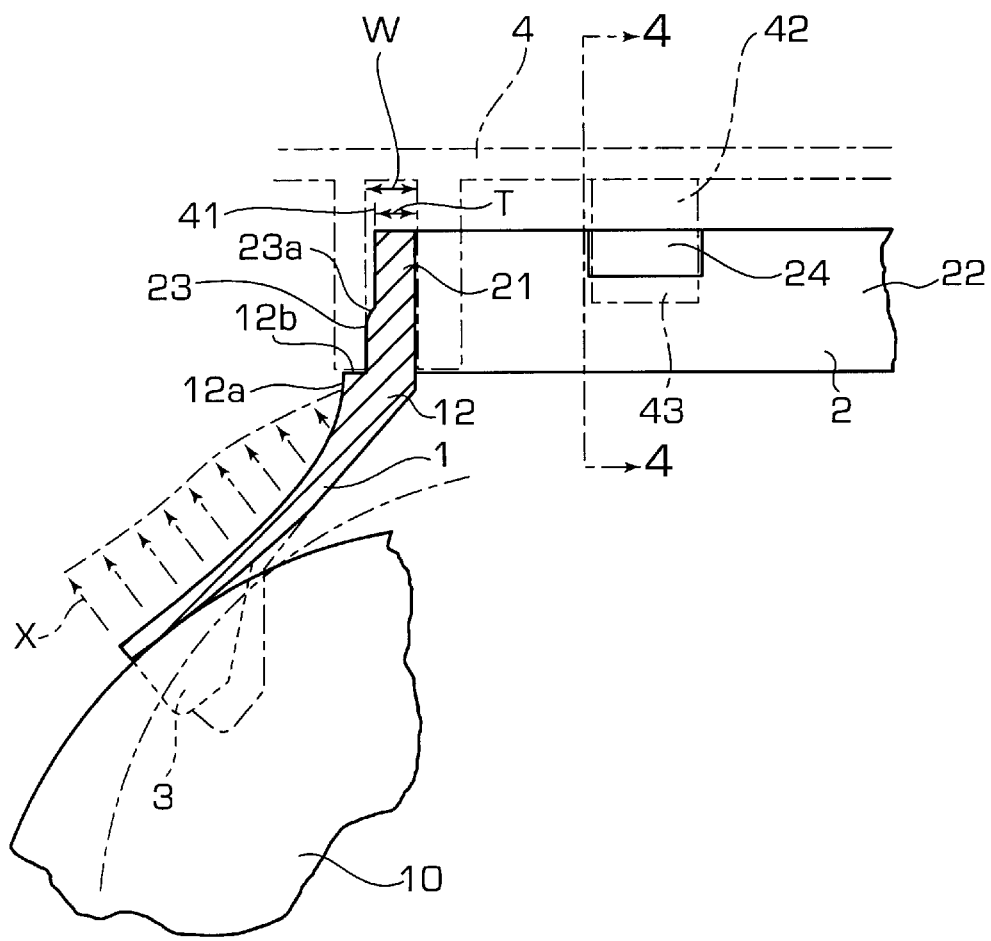
FIG. 4 is a schematic diagram showing the stress distribution in the wafer holding structure when vibration or jarring occurs.
Figure 5:
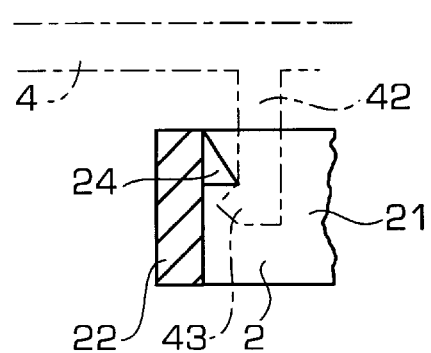
FIG. 5 is a partial cross-section view along the line C—C in FIG. 4.
Figure 6:
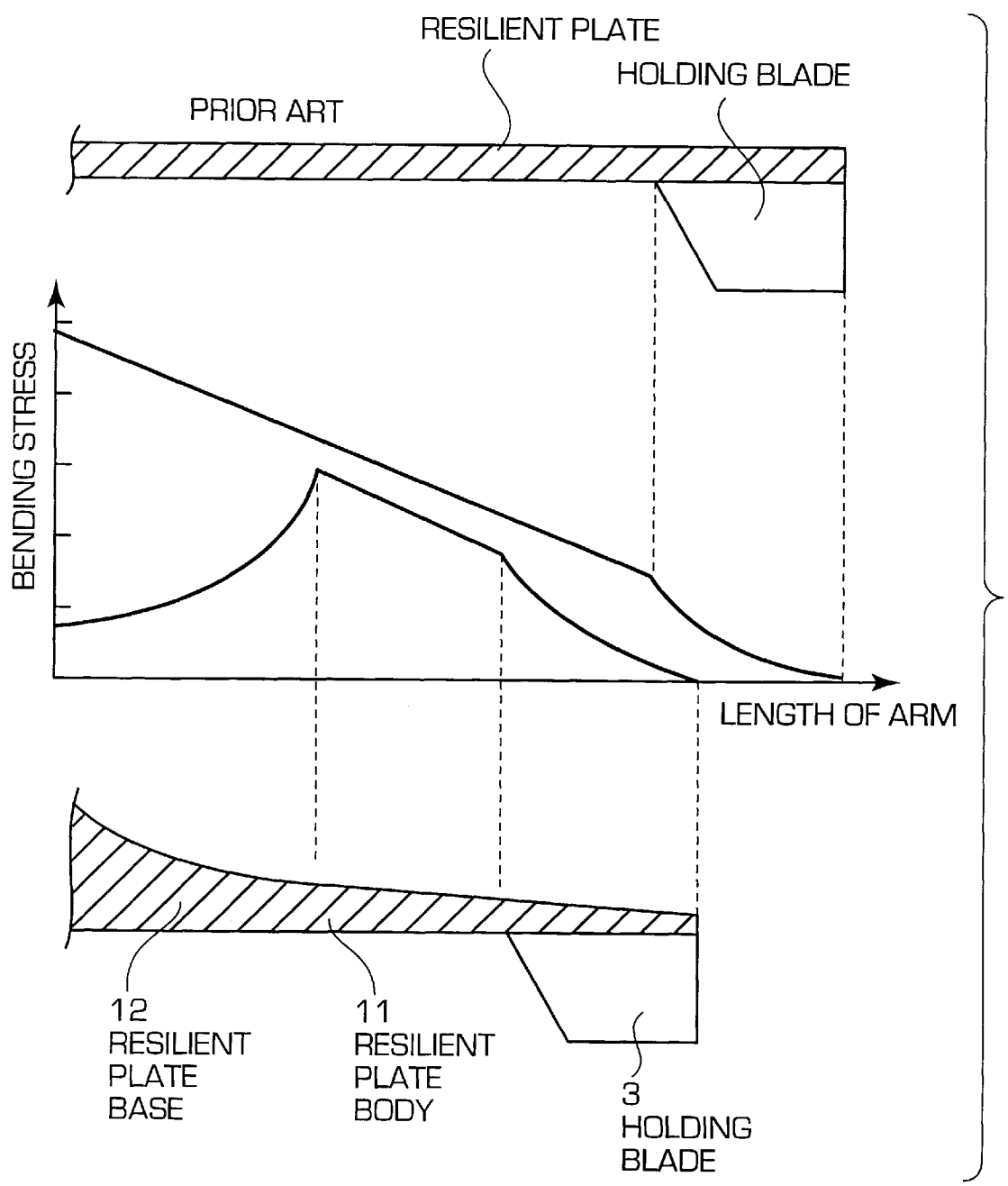
FIG. 6 is a comparison graph showing the bending stress in a holding blade of this invention and a conventional wafer holding structure.

FIG. 1 is an enlarged perspective view of part of the wafer holding structure according to this invention. FIG. 2 is a cross-section view along the line A—A in FIG. 1. FIG. 3 is a cross-section view along the line B—B in FIG. 2. FIG. 4 is a schematic diagram showing the stress distribution in a wafer holding structure when vibration or jarring occurs. FIG. 5 is a partial cross-section view along the line C—C in FIG. 4. FIG. 6 is a comparison graph showing the bending stress in the wafer holding structure of this invention and those of the prior art. FIG. 7 is a graph showing the relationships between the displacements of the holding blade and the bending stresses induced in the wafer holding structure of this invention and those in the conventional art.

As shown in FIG. 1, the wafer holding structure of this embodiment is composed of a frame portion 2 capable of engaging with a cover 4 (FIG. 4) in a detachable manner, a plurality of holding blades 3 in contact with the wafers 10, and a elastic plate 1 being provided with elasticity and urging the holding blades 3 toward wafers 10. Each of the holding blades 3 is formed separately from its neighboring holding blades 3 and a clearance exists between each pair of neighboring holding blades 3.

The elastic plate 1 includes an elastic plate body 11 whose top end is provided with the holding blades 3, and an elastic plate base 12. The elastic plate body 11 is separate from neighboring elastic plate bodies 11 of other elastic plates 1, and each elastic plate base 12 is formed integrally with its corresponding elastic plate body 11 and is connected with the frame portion 2.

Furthermore, a shoulder portion 13 extending outward from the elastic plate body 11 is formed on the elastic plate base 12.

As shown in FIG. 2, the cross-section of the elastic plate 1 is a taper whose thickness decreases from the junction of the elastic plate base 12 and the frame portion 2 toward the top end of the elastic plate body 11. In addition, the outer side surface 12a of the elastic plate 1 is curved.

Furthermore, the upper portion of the elastic plate base 12, having the largest thickness, extends outward and is formed like a terrace and is named terrace portion 12b.

As shown in FIG. 3, the cross-section of the elastic plate body 11 is a substantially rectangular shape with a larger width in the horizontal direction. By this arrangement, it is difficult of the elastic plate body 11 to be twisted by an eccentric force coming from the wafer 10.

Furthermore, compared with the conventional "V" shapes, the cross-section of the holding blade 3 is in the form of a deep "U" shape. Therefore, the wafer 10 may not disengage with the holding blade 3 even if the holding blade 3 is displaced a small amount.

As shown in FIG. 1, the parting line 31 incurred by injection mold (not shown) of the holding blade is located at the top end of the holding blade 3. The parting line 31 does not contact with the wafer 10 when the holding blade 3 pushes down the wafer 10. Thus, the production of dust particles can be prevented.

The following is a description of the function of the wafer holding structure 3 when a semiconductor wafer accommodated within a container is subject to vibration or jarring during its transportation.

As shown in FIG. 4, the wafer 10 accommodated within a container pushes the holding member when subject to external vibration or jarring during its transportation, and the holding blade 3 displaces. Thus, the elastic plate 1 bends outward.

Regarding to the stress X in the elastic plate 1 in response to the force coming from the wafer 10, because the cross-section of the elastic plate 1 is shaped like a taper, the stress distribution X in the bent portion of in the elastic plate 1 is dispersed and converges at the elastic base 12 having a larger thickness. No stress exists at the junction of the elastic plate base 12 and the frame portion 2.

The graphs showing the bending stress in a wafer holding structure of this invention and a conventional wafer holding structure are respectively depicted in FIG. 6.

Specifically, in the structure of a conventional wafer holding structure, the bending stress increases toward the junction of the frame portion when the holding blade receives a force, and the bending stress reaches its maximum value at the junction of the frame portion. Nevertheless, in the structure of a wafer holding structure according to this invention, the stress is dispersed within the whole elastic plate when the holding blade receives the force of the same magnitude, and contrary to conventionally structures, the bending stress decreases toward the junction of the frame portion.

Especially, because the outer side surface 12a of the elastic plate 1 of this embodiment is in the form of a curved shape, the stress decreases sharply from the location near the curved portion and eventually converges.

Furthermore, the relationship between the displacements of the holding blade and the bending stresses induced in a wafer holding structure of this invention and a conventional wafer holding structure is depicted in FIG. 7. Specifically, the tangent of the curve denoting the increase of the bending stress in response to the increase of the displacement of the holding blade in this invention is sharper than that of the curve in conventional structures. Therefore, to obtain a displacement of the holding blade M, a greater force is required in the structure of this invention than required in conventional ones. From another perspective, applying a force P, the displacement of the holding blade produced in the structure of the wafer holding structure of this invention is smaller than that produced in the conventional art. Therefore, it is obvious that it is difficult for the wafer to disengage from the holding blade of this invention.

Furthermore, as shown in FIG. 3, the holding blade 3 is deeply formed and the elastic plate body 11 of the elastic plate 1 is a shape that cannot be twisted easily. Therefore, the wafer 10 can be furthermore prevented from disengaging from with the holding blade 3. Incidentally, the holding blade 3 is designed in such a manner that prior to the disengagement of the holding blade 3 with the wafer 10 as a result of external vibration or jarring, the stress in the elastic plate 1 increases (see FIG. 7) to prevent the wafer 10 from going beyond the holding blade 3.

The following is a description of the installation structure of the cover 4.

The frame portion 2 of the holding blade of this embodiment is in the form of a rectangular shape. As shown in FIG. 1, the frame portion 2 consists of a longitudinal portion 21 connecting with the elastic plate 1, and two side portions 22 adjoined to two side ends of the longitudinal portion 21.

The elastic plate base 12 of the elastic plate 1 is adjoined to the lower end of the longitudinal portion 21, and the terrace portion 12b of the elastic plate 1 extends outside of the longitudinal portion 21. In addition, a plurality of protrusions 23, having curved surfaces 23a on their top ends, are formed on the outer sidewall of the longitudinal portion 21, the number of the protrusions 23 is set to be the same as that of the holding blades 3. Each of the protrusions 23 is located on the extending line of the corresponding elastic plate body 11.

Two sets of frame engaging claws 24 are formed on the inner sidewalls of the two side portions 22. As described hereinafter, the frame engaging claws 24 are used to engage with the cover 4.

As shown in FIG. 4, the width W of the installation slot 41 of the cover 4 is set to be larger than the thickness T of the longitudinal portion 21. By this arrangement, the longitudinal portion 21 can be easily inserted into the installation slot 41 during installation.

Furthermore, the protrusions 23 are embedded into the installation slot 41 by following the inserting of the frame portion 2, thereby preventing wobbing. In addition, due to the fact that curved surfaces 23a are formed on the top ends of the protrusions 23, the frame portion can be easily inserted into the installation slot 41.

As shown in FIGS. 4 and 5, a plurality of cover engaging portions 42 capable of engaging with the frame engaging claws 24 are formed on the cover 4. The frame portion 2 can be prevented from disengaging with the cover 4 by engaging the frame engaging claws 24 with the cover engaging claws 43 of the cover engaging portions 42.

In this embodiment, the two side portions 22 must be pressed onto the cover engaging portions 42 of the cover 4 to install the wafer holding structure and the two side portions 22 must be pulled outward to detach frame engaging claws 24 from the cover engaging claws 43.

Therefore, the longitudinal portion 21 are not touched during installation or disengagement, and the holding blades 3 or the elastic plate 1 can be protected from being contaminated, distorted, or damaged.

Furthermore, as shown in FIG. 4, at the state the frame portion 2 of the wafer holding structure is installed on the cover 4, the terrace portion 12b is kept in contact with the cover 4 to act as a stopper. Therefore, the junction between the elastic plate 1 and the frame portion 2 does not become greasy or is not damaged even if a load is applied thereon.

The structure of this invention has been described above, the load applied to the segment, commencing from the junction between the elastic plate and the frame portion of the wafer holding structure to the top end of the holding blade, can be dispersed. Therefore, the load applied to the junction of the elastic plate is not concentrated on one point, and distortion or damage of the elastic plate can thus be prevented.

Furthermore, due to the shape of the cross-section of the elastic plate and the structure of the root of the elastic plate base, it is difficult for the elastic plate to be twisted. Therefore, disengagement of semiconductor wafers from the holding blades can be prevented even subject to vibration or jarring during transportation.

Furthermore, wobbling can be prevented when the wafer holding structure blades are installed on the cover by forming protrusions and engaging claws on the frame portion which is used to install the wafer holding structure on the cover.

What is claimed is:

1. A wafer holding structure for a semiconductor wafer container, which is disposed within the semiconductor wafer container and is used to push down and hold semiconductor wafers accommodated within the semiconductor wafer container, comprising:

an elastic member formed at a top end of said semiconductor wafer holding structure, said elastic member having a base portion and a plurality of body portions extending from said base portion to define a plurality of finger-like structures; and a plurality of holding blades for contacting respective semiconductor wafers, said plurality of holding blades formed at respective distal ends of said plurality of body portions opposite said base portion so as to be pivotable about said base portion;

wherein each of said plurality of holding blades is separate from adjacent blades, each of said plurality of body portions is separate from adjacent body portions, and said base portion is formed into one integral unitary structure;

wherein said base portion elastically resists an upward movement of each of said plurality of holding blades; and wherein said base portion has a terrace portion formed at one end of said base portion.

2. A wafer holding structure for a semiconductor wafer container, which is disposed within the semiconductor wafer container and is used to push down and hold semiconductor wafers accommodated within the semiconductor wafer container, comprising:

an elastic member formed at a top end of said semiconductor wafer holding structure, said elastic member having a base portion and a plurality of body portions extending from said base portion to define a plurality of finger-like structures;

a plurality of holding blades for contacting respective semiconductor wafers, said plurality of holding blades formed at respective distal ends of said plurality of body portions opposite said base portions so as to be pivotable about said base portion; and shoulder portions extending outward from opposite sides of said base portion in a direction perpendicular to longitudinal axes for said body portions, wherein the longitudinal axis for each body portion extends along a center line of said body portion from said base portion to the distal end of said body portion;

wherein each of said plurality of holding blades is separate from adjacent blades, each of said plurality of body portions is separate from adjacent body portions, and said base portion is formed into one integral unitary structure; and wherein said base portion elastically resists an upward movement of each of said plurality of holding blades.

3. A wafer holding structure for a semiconductor wafer container, which is disposed within the semiconductor wafer container and is used to push down and hold semiconductor wafers accommodated within the semiconductor wafer container, comprising:

an elastic member formed at a top end of said semiconductor wafer holding structure, said elastic member having a base portion an a plurality of body portions extending from said base portion to define a plurality of finger-like structures; and a plurality of holding blades for contacting respective semiconductor wafers, said plurality of holding blades formed at respective distal ends of said plurality of body portions opposite said base portion so as to be pivotable about said base portion;

wherein each of said plurality of holding blades is separate from adjacent blades, each of said plurality of body portions is separate from adjacent body portions, and said base portion is formed into one integral unitary structure;

wherein said base portion elastically resists an upward movement of each of said plurality of holding blades; and wherein said elastic member is tapered to have a decreasing thickness from said base portion to said distal ends of said body portions; and wherein parting lines formed during a molding of said holding blades are located at top ends of said holding blades so as not to contact the semiconductor wafers held by said holding blades.

4. A wafer holding structure for a semiconductor wafer container, which is disposed within the semiconductor wafer container and is used to push down and hold semiconductor wafers accommodated within the semiconductor wafer container, comprising:

an elastic member formed at a top end of said semiconductor wafer holding structure, said elastic member having a base portion and a plurality of body portions extending from said base portion to define a plurality of finger-like structures;

a plurality of holding blades for contacting respective semiconductor wafers disposed on said elastic member at respective distal ends of said body portions; and a frame portion attached to said elastic member at an end of said base portion opposite said plurality of body portions such that said base portion protrudes from said frame portion;

wherein said base portion elastically resists an upward movement of each of said plurality of holding blades; and wherein said elastic member is installed on a cover of said container by inserting the frame portion into an install slot formed in the cover, a thickness of the frame portion is set to be smaller than a width of the install slot and a plurality of protrusions are formed on side walls of the frame portion.

5. The wafer holding structure for a semiconductor wafer as claimed in claim 4;

wherein the number of said protrusions is equal to that of said holding blades, and said protrusions extend from said base portion of said elastic member.

6. A wafer holding structure for a semiconductor wafer container, which is disposed within the semiconductor wafer container and is used to push down and hold semiconductors wafers accommodated within the semiconductor wafer container, comprising:

an elastic member formed at a top end of said semiconductor wafer holding structure, said elastic member having a base portion and a plurality of body portions extending from said base portion to define a plurality of finger-like structures;

a plurality of holding blades for container respective semiconductor wafers disposed on said elastic member at respective distal ends of said body portions; and a frame portion attached to said elastic member at an end of said base portion opposite said plurality of body portions such that such base portion protrudes from said frame portion, said frame portion having frame engaging claws;

wherein said base portion elastically resists an upward movement of each of said plurality of holding blades; and wherein said elastic member is installed on a cover of said container by way of the frame portion, said frame engaging claws used to secure the frame to the cover by engaging with corresponding install claws of the cover said frame engaging claws formed on sides of the frame portion which are not attached to said holding blades.

7. A wafer holding structure for a semiconductor wafer container, which is disposed within the structure wafer container and is used to push down and hold semiconductor wafers accommodated within the semiconductor wafer container, comprising:

an elastic member formed at a top end of said semiconductor wafer holding structure, said elastic member having a base portion and a plurality of body portions extending from said base portion to define a plurality of finger-like structures; and a plurality of holding blades for contacting respective semiconductor wafers, said plurality of holding blades formed at respective distal ends of said plurality of body portions opposite said base portions so as to be pivotable about said base portion, wherein each of said plurality of holding blades is separate from adjacent blades, each of said plurality of body portions is separate from adjacent body portions, and said base portion is formed into one integral unitary structure;

wherein said base portion elastically resists an upward movement of each of said plurality of holding blades; and wherein said base portion is tapered to have a decreasing thickness along at least a portion of said base portion from one end of said base portion to an opposite end of said base portion where said base portion meets said plurality of body portions.

8. The wafer holding structure for a semiconductor wafer container as claimed in claim 7, wherein said base portion is tapered to have a decreasing thickness along an entire length of said cross-section of said base portion.

* * * * *